(12) United States Patent
Yamazawa et al.

(10) Patent No.: US 10,916,410 B2
(45) Date of Patent: Feb. 9, 2021

(54) PLASMA PROCESSING APPARATUS

(71) Applicant: TOKYO ELECTRON LIMITED, Tokyo (JP)

(72) Inventors: Yohei Yamazawa, Yamanashi (JP); Atsuki Furuya, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 210 days.

(21) Appl. No.: 16/068,696

(22) PCT Filed: Jan. 10, 2017

(86) PCT No.: PCT/JP2017/000469
§ 371 (c)(1),
(2) Date: Jul. 9, 2018

(87) PCT Pub. No.: WO2017/126365
PCT Pub. Date: Jul. 27, 2017

(65) Prior Publication Data
US 2019/0019653 A1    Jan. 17, 2019

(30) Foreign Application Priority Data
Jan. 19, 2016   (JP) ................. 2016-007909

(51) Int. Cl.
*C23C 16/00*   (2006.01)
*H01L 21/306*   (2006.01)
(Continued)

(52) U.S. Cl.
CPC .. *H01J 37/32183* (2013.01); *C23C 16/45536* (2013.01); *C23C 16/45546* (2013.01);
(Continued)

(58) Field of Classification Search
CPC ................. H01J 37/321; H01J 37/3211; H01J 37/32119; H01J 37/32128;
(Continued)

(56) References Cited

U.S. PATENT DOCUMENTS 5,272,417 A * 12/1993 Ohmi ................ H01J 37/32082
156/345.47
5,478,429 A   12/1995 Komino et al.
(Continued)

FOREIGN PATENT DOCUMENTS

JP    H6-243992 A     12/1994
KR    10-2004-0007351 A    1/2004
WO    WO 2013/186381 A1 *  12/2013  ............... H03H 7/40

OTHER PUBLICATIONS

International Search Report dated Mar. 21, 2017.

*Primary Examiner* — Luz L Alejandro Mulero
(74) *Attorney, Agent, or Firm* — Fenwick & West LLP

(57) ABSTRACT

A plasma processing apparatus includes a processing chamber, a high frequency power supply and a load variation stabilization circuit. The high frequency power supply is configured to supply a high frequency power to the processing chamber and generate plasma inside the processing chamber. The load variation stabilization circuit is connected in parallel with the processing chamber at a connection portion provided between the high frequency power supply and the processing chamber. The load variation stabilization circuit is configured to suppress variation in a load impedance when viewing a downstream side from the connection portion.

7 Claims, 8 Drawing Sheets

(51) Int. Cl.
*H01J 37/32* (2006.01)
*C23C 16/509* (2006.01)
*C23C 16/455* (2006.01)
*C23C 16/52* (2006.01)
*H05H 1/46* (2006.01)

(52) U.S. Cl.
CPC .......... *C23C 16/509* (2013.01); *C23C 16/52* (2013.01); *H01J 37/32* (2013.01); *H01J 37/32458* (2013.01); *H05H 1/46* (2013.01); *H05H 2001/4682* (2013.01)

(58) Field of Classification Search
CPC .......... H01J 37/32137; H01J 37/32146; H01J 37/32155; H01J 37/32165; H01J 37/32174; H01J 37/32183; H01J 37/32045; H01J 37/32082; H01J 37/32091
See application file for complete search history.

(56) References Cited

U.S. PATENT DOCUMENTS

| | | | |
|---|---|---|---|
| 6,259,334 B1 * | 7/2001 | Howald | H01J 37/32183 315/111.21 |
| 2002/0007915 A1 * | 1/2002 | Hirose | H01J 37/32082 156/345.12 |

* cited by examiner

| | BEFORE LOAD VARIATION | AFTER LOAD VARIATION | VARIATION AMOUNT |
|---|---|---|---|
| Rp | 1.0 | 1.5 | 0.5 |
| Rtot | 0.25 | 0.375 | 0.125 |

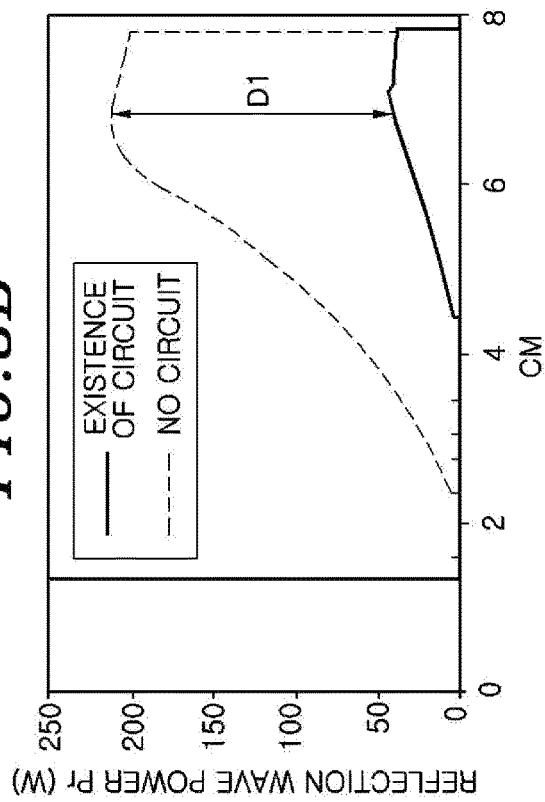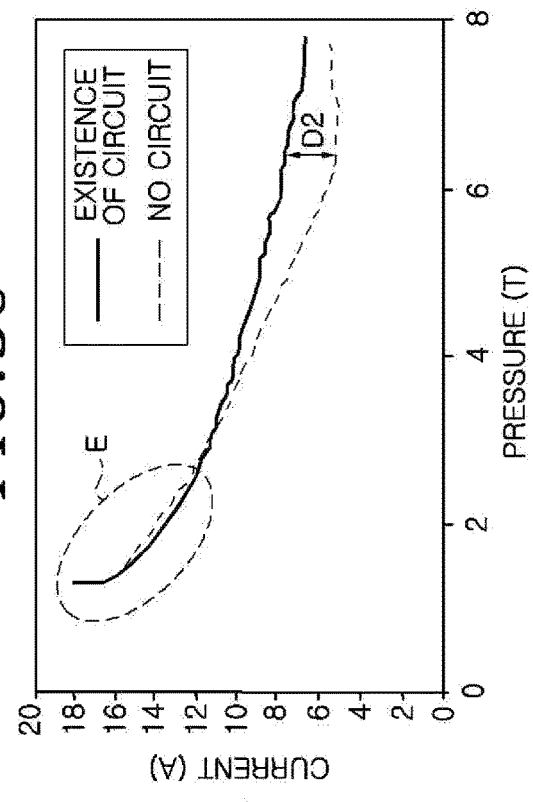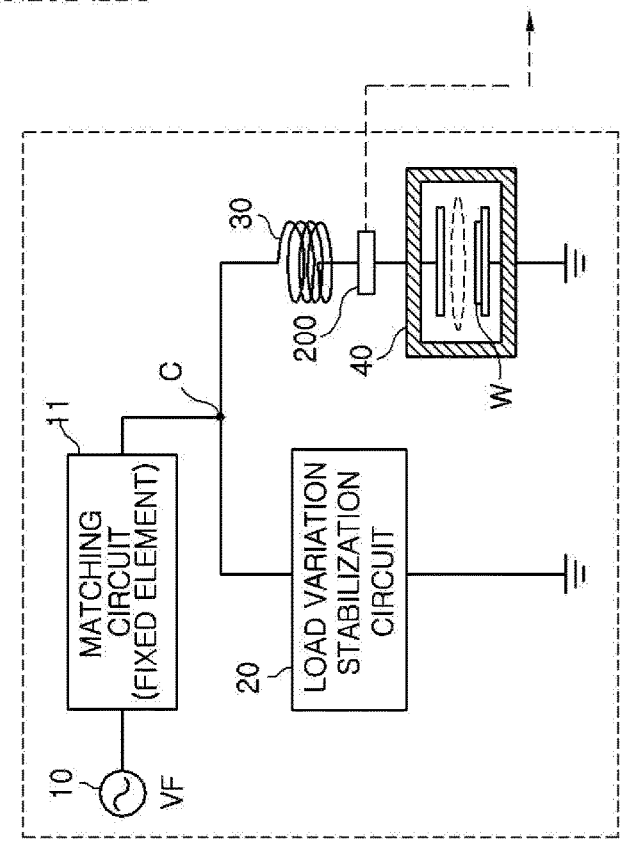

PLASMA PROCESSING APPARATUS

FIELD OF THE INVENTION

The present invention relates to a plasma processing apparatus.

BACKGROUND OF THE INVENTION

A method of forming a film by switching two or more steps at a high speed, such as PEALD (Plasma Enhanced Atomic Layer Deposition) or the like, is getting more and more important because it enables high-quality film formation. When set pressures in two or more steps are different, it is preferable to perform each step after a pressure in a processing chamber is stabilized to the set pressure. However, a method of forming a film by cyclic execution of two or more steps by ALD (Atomic Layer Deposition) is disadvantageous in that a film formation rate is low and a throughput needs to be improved. Therefore, in order to improve the throughput, a film is formed by turning on and off plasma at a high speed by switching the steps at a high speed without waiting for stabilization of the pressure.

When a duration of plasma application during a cycle is as short as several seconds and a process pressure varies considerably between the steps, it is significant to realize high-speed plasma ignition and stabilization of the pressure in the processing chamber in each step.

It is difficult for a conventional matching device using a variable capacitor and the like to perform impedance matching in response to the high-speed switching of the steps. Therefore, it is proposed to use a frequency variable power supply for impedance matching (see, e.g., Japanese Patent Application Publication. No. H6-243992).

The frequency variable power supply has a function of changing an output frequency and has an impedance matching speed faster than that of the matching device. However, the frequency variable power supply has a narrow matching range. Thus, only an imaginary number component (X component=reactance) of a load impedance of a plasma side is matched within a narrow matching range, and a real number component (R component) is not matched. Accordingly, in the frequency variable power supply, especially when a high frequency power is supplied to plasma beyond the matching range, large reflection occurs and the power may not be transmitted to the plasma side. As a result, it is difficult to stably ignite and maintain the plasma only by the function of the frequency variable power supply.

SUMMARY OF THE INVENTION

In view of the above, the present invention provides a technique of suppressing variation in a load impedance of a plasma side.

In accordance with an aspect, there is provided a plasma processing apparatus including: a processing chamber; a high frequency power supply configured to supply a high frequency power to the processing chamber and generate plasma inside the processing chamber; and a load variation stabilization circuit connected in parallel with the processing chamber at a connection portion provided between the high frequency power supply and the processing chamber and configured to suppress variation in a load impedance when viewing a downstream side from the connection portion.

Effects of the Invention

In accordance with one embodiment of the present invention, the variation in the load impedance of the plasma side can be suppressed.

BRIEF DESCRIPTION OF THE DRAWINGS

FIGS. 8A to 8C show a reflection wave and power efficiency according to one embodiment.

DETAILED DESCRIPTION OF THE EMBODIMENTS

Figure 1:
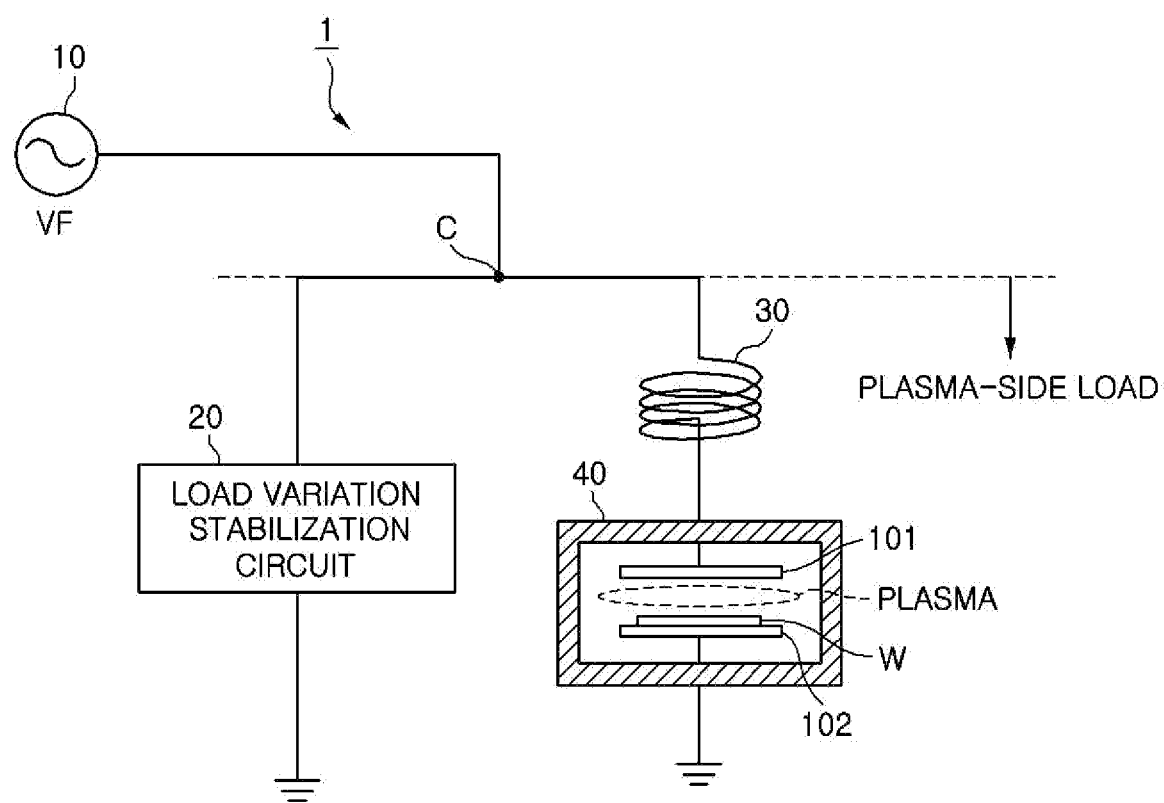
FIG. 1 shows an example of a plasma processing apparatus according to one embodiment.

Hereinafter, embodiments will be described with reference to the accompanying drawings. Like reference numerals will be given to substantially like parts throughout this specification and the drawings, and redundant description thereof will be omitted.

(Introduction)

A method of forming a film by switching two or more steps at a high speed, such as PEALD (Plasma Enhanced Atomic Layer Deposition) or the like, is getting more and more important because it enables high-quality film formation. When a duration of plasma application during a cycle is as short as several seconds and a process pressure varies considerably between the steps, it is significant to realize high-speed plasma ignition and stabilization of the pressure in the processing chamber.

Therefore, in the plasma processing apparatus of the present embodiment, when a film is formed by switching the steps at a high speed under an environment where a pressure varies considerably, plasma is stably generated by supplying sufficient power to the plasma while suppressing reflection of the high frequency power at the plasma side.

Accordingly, in the present embodiment, there is proposed a plasma processing apparatus that satisfies the following three conditions.

1. Turning on and off the plasma quickly and stably (without large reflection of the high frequency power) while the pressure is varying considerably 2. Suppressing variation in a load impedance even if a high frequency power having a frequency of 13 MHz or more is supplied 3. Cost-effective system (without using a high-performance matching unit or the like)

Hereinafter, an example of a configuration of the plasma processing apparatus that satisfies the above conditions will be described with reference to FIG. 1.

(Configuration of Plasma Processing Apparatus)

A plasma processing apparatus 1 includes a frequency variable power supply 10, a load variation stabilization circuit 20, a power feed line 30, and a processing chamber 40. In the present embodiment, a capacitively coupled plasma processing apparatus is used as the plasma processing apparatus 1 to which a high frequency power is supplied.

The plasma processing apparatus 1 of the present embodiment may be an inductively coupled plasma (ICP) processing apparatus or the like, other than the capacitively coupled plasma (CCP) apparatus.

In this specification, a semiconductor wafer W will be described as a plasma processing target. However, the plasma processing target is not limited thereto, and may also be various substrates for use in LCD (Liquid Crystal Display), FPD (Flat Panel Display) or the like, a photomask, a CD substrate, a printed circuit board, or the like.

The frequency variable power supply 10 is an example of a power supply for supplying a high frequency power having a frequency of 13 MHz or more at a desired power level. The frequency variable power supply 10 has a function of performing matching with a load impedance of a plasma side by changing an output frequency. As for the power supply for supplying the high frequency power, a high frequency power supply having no function of changing an output frequency may be used instead of the frequency variable power supply 10.

In the processing chamber 40, a high frequency power of a predetermined frequency is supplied from the frequency variable power supply 10 to an electrode or a plasma excitation antenna (in the case of ICP) provided in the processing chamber 40. A gas supplied into the processing chamber 40 is ionized and dissociated by the high frequency power. Accordingly, plasma is generated in a plasma processing space between an upper electrode 101 and a lower electrode 102. A semiconductor wafer W mounted on the lower electrode 102 is subjected to microprocessing such as etching, film formation or the like by the plasma.

A connection Portion C (predetermined connection portion) that is an electrical base point is provided between the frequency variable power supply 10 and the processing chamber 40. The load variation stabilization circuit 20 is connected at the connection portion C in parallel with the processing chamber 40 where plasma treatment is performed and suppresses variation in a load impedance (hereinafter, referred to as "load impedance of plasma-side circuit" or "load of plasma-side circuit") when viewing a plasma side (downstream side or low potential side) from the connection portion C. In the example of FIG. 1, the plasma-side circuit includes a processing chamber-side load including the power feed line 30 from the connection portion C to the plasma, and the load variation stabilization circuit 20 connected in parallel to the processing chamber-side load.

Here, the load of the processing chamber side includes not only the load impedance of the plasma but also the impedance of the power feed line 30 from the plasma to the connection portion C. In general, the plasma is a C (capacitance) component. Here, the power feed line 30 that is a power feed line of a high frequency is made of a metal bar (made of copper). However, the metal bar itself has an L (inductance) component. Therefore, a sign of the load of the processing chamber side may change depending on a base point. Accordingly, in the present embodiment, the connection portion C between the processing chamber 40 and the load variation stabilization circuit 20 in the power feed line connected to the frequency variable power supply is set to the base point of the load impedance when viewing the plasma side, i.e., the load of the plasma side, and the load of the processing chamber side. As a result, the load of the processing chamber side is obtained by adding the impedance of the power feed line 30 from the plasma to the connection portion C to the load impedance of the plasma.

Figure 2A:
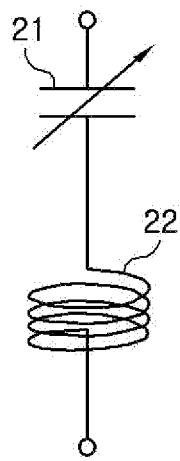
FIGS. 2A and 2B show examples of a load variation stabilization circuit including an IC series circuit according to one embodiment.
Figure 2B:
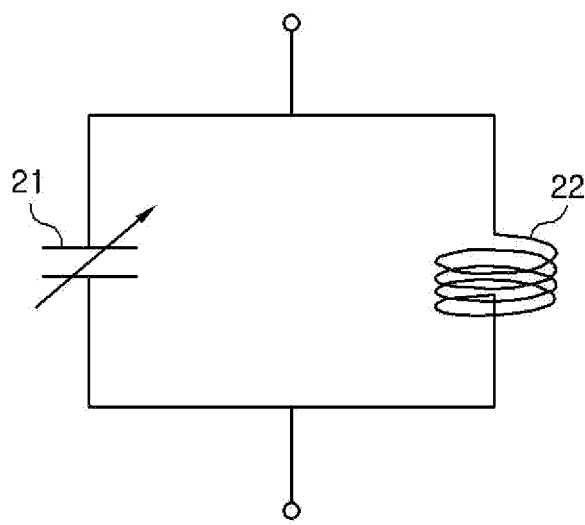

As shown in FIGS. 2A and 2B, the load variation stabilization circuit 20 includes at least one of a variable capacitor 21 and a coil 22, or a combination thereof. In FIGS. 2A and 2B, the load variation stabilization circuit 20 includes the variable capacitor 21 and the coil 22. The variable capacitor 21 and the coil 22 may be connected in series as shown in FIG. 2A, or may be connected in parallel as shown in FIG. 2B.

Elements constituting the load variation stabilization circuit 20 may be variable elements or fixed elements. In other words, the elements constituting the load variation stabilization circuit 20 are not limited to the variable capacitor 21 or the coil 22, and may be a fixed capacitor or a variable coil, or a combination thereof.

In the case of using the variable capacitor and the variable coil for the load variation stabilization circuit the performance is enhanced compared to the case of using fixed elements. However, the cost is also increased. In the variable capacitor and the variable coil, a user's setting operation is required, which is complicated. Therefore, the fixed elements may be used as long as the variation in the load of the plasma side can be suppressed to a certain constant impedance regardless of a process recipe (in which a pressure, a power and a gas system are set).

At least one of the coil and the capacitor of the load variation stabilization circuit 20 may be variable when adjustment is required for each process recipe. In that case, high-speed variation unnecessary, so that the variable elements can operate by driving a motor conventionally.

(Load Variation Stabilization Circuit)

Figures 3, 4:
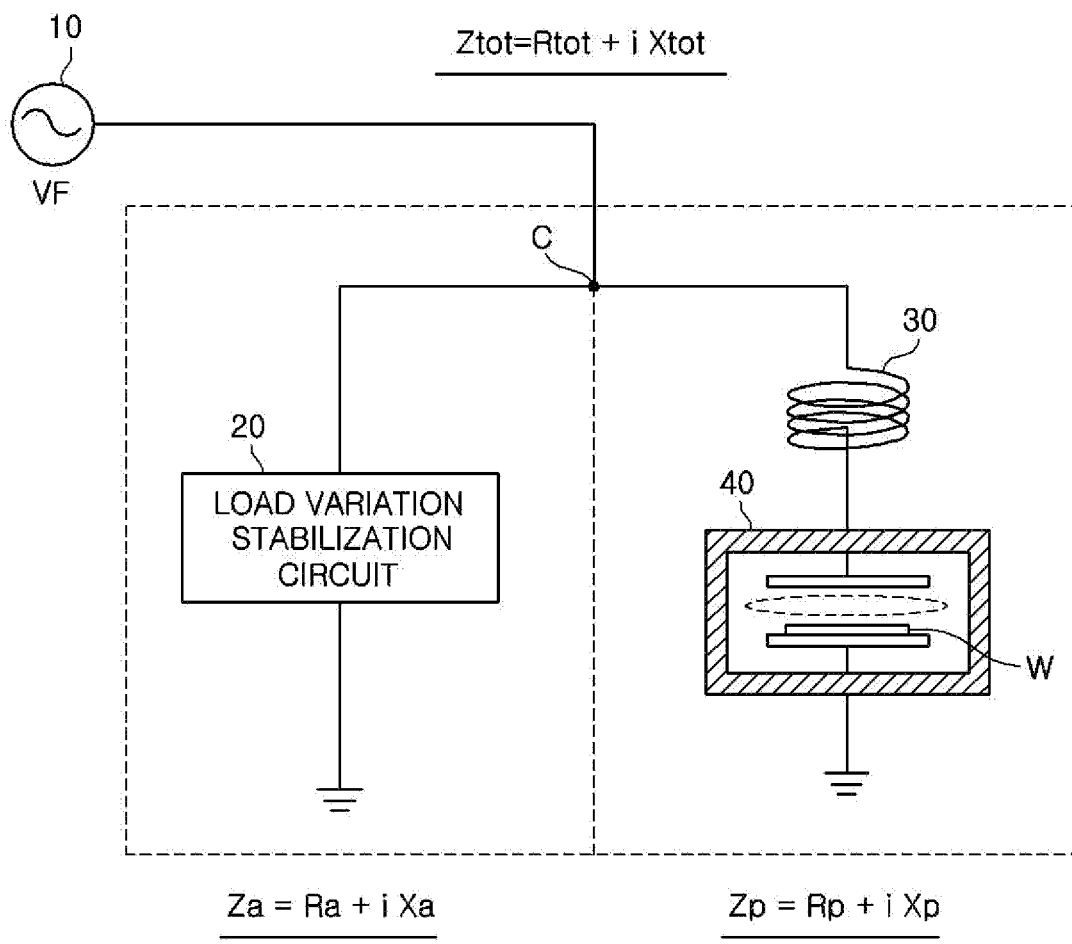
FIG. 3 explains impedances of the plasma processing apparatus according to the embodiment.
FIG. 4 explains an effect of suppressing variation in a load of a plasma side according to one embodiment.

Next, the function of the load variation stabilization circuit 20 will be described in detail. As shown in FIG. 3, an impedance Za of the load variation stabilization circuit 20 connected in parallel from the connection portion C and a load impedance Zp of the processing chamber-side circuit (i.e., the load impedance when viewing the processing chamber side including the plasma from the connection portion C) are expressed by the following equations.

Impedance of the load variation stabilization circuit:
$Z_a = R_a + iX_a$

Load impedance of the processing chamber side:
$Z_p = R_p + iX_p$

A total impedance (load of the plasma side) Ztot that is the sum of the impedance of the load variation stabilization circuit and the load impedance of the processing chamber side expressed by the following equation.

Total impedance (load of the plasma side):
$Z_{tot} = R_{tot} + iX_{tot}$ (a) Ra that an R (resistance) component of the load variation stabilization circuit 20 of the present embodiment is preferably as small as possible. If Ra of the load variation stabilization circuit 20 is large, loss of the high frequency power in the load variation stabilization circuit 20 is increased. Therefore, the high frequency power supplied to the plasma side is decreased, and the power efficiency deteriorates.

(b) Further, Xa as an X (reactance) component of the load variation stabilization circuit 20 of the present embodiment has the same sign as that of Xp as an X component of the load impedance of the processing chamber side. Xa of the load variation stabilization circuit 20 is equal to the load impedance Xp of the processing chamber-side circuit or within a predetermined range with respect to the load impedance Xp of the processing chamber-side circuit. Both of the sign of Xa of the load variation stabilization circuit 20 and the sign of Xp of the load impedance of the processing chamber-side circuit are positive.

In the plasma processing apparatus 1 of the present embodiment, it is important to set the sign of the load of the processing chamber-side circuit which is surrounded by dotted lines at the right hand of the connection portion C to be the same as that of the load of the load variation stabilization circuit 20 side which is surrounded by dotted lines at the left hand of the connection portion C in FIG. 3. Xa of the load variation stabilization circuit 20 is equal to Xp of the processing chamber side or within predetermined range with respect to Xp of the processing chamber side. Accordingly, the variation in the load of the plasma side can be suppressed by the load variation stabilization circuit 20 without providing a high-performance and high-cost matching circuit. Hereinafter, the reason that the sign of the X component of the load variation stabilization circuit 20 needs to be the same as that of the X component of the load of the processing chamber side will be described.

(Reason that X components of the load variation stabilization circuit and the load of the plasma side need to have the same sign)

The total impedance Ztot obtained by adding the load impedance Zp of the processing chamber-side circuit and the impedance Za of the load variation stabilization circuit 20 is expressed by the following equation (1).

$$Z_{tot} = \frac{R_a^2 R_p + R_a R_p^2 + X_a^2 R_p + R_a X_p^2}{(R_p + R_a)^2 + (X_p + X_a)^2} + i \frac{R_a^2 X_p + X_a X_p^2 + X_a^2 X_p + X_a R_p^2}{(R_p + R_a)^2 + (X_p + X_a)^2} \quad (1)$$

Referring to the equation (1), when Xp as the X component of the load impedance Zp of the processing chamber-side circuit and Xa as the X component of the impedance Za of the load variation stabilization circuit 20 have different signs, denominators of the first and the second term of the total impedance Ztot become smaller (i.e., $(Xp+Xa)^2$ becomes smaller). Therefore, numerators of the first and the second term become relatively greater. Accordingly, when Rp of the R component or Xp of the X component of the load impedance Zp of the processing chamber-side circuit is changed, the total impedance Ztot varies considerably even if the load variation stabilization circuit 20 is provided.

The above equation (1) is simplified to the following equation (2), for convenience of explanation. The actual impedances Ztot, Za and Zp are calculated based on the non-simplified equation (1).

Based on the above condition (a), the load variation stabilization circuit 20 has low loss. Therefore, Ra of the load variation stabilization circuit 20 may be substantially "0". Accordingly, "0" is substituted for the real number component Ra of the impedance Za of the load variation stabilization circuit 20 of the equation (1).

The real number component Rp of the load impedance Zp of the processing chamber-side circuit is considerably smaller than the sum of the imaginary number component Xp and the imaginary number component Xa of the load variation stabilization circuit. Therefore, the relation of Rp<<Xp+Xa is satisfied. Based on the above conditions, the equation (2) is derived from the equation (1).

$$Z_{tot} \sim \frac{X_a^2 R_p}{(X_p + X_a)^2} + i \frac{X_p^2 + X_a X_p + R_p^2}{(X_p + X_a)^2} X_a \quad (2)$$

The frequency variable power supply 10 can respond to the change in the imaginary number component Xp of the load impedance Zp of the processing chamber-side circuit. However, the frequency variable power supply 10 cannot respond to the change in the real number component Rp of the load impedance Zp of the processing chamber-side circuit and, thus, reflection waves are generated. Therefore, it is assumed that the frequency variable power supply 10 can respond to the variation in the load of the plasma side shown in the second terra based on the equation (2). Here, only the first term will be described, for convenience of description. However, in actual control, the load variation stabilization circuit 20 functions to suppress the variation in the load of the plasma side depending on the load impedance Zp of the processing chamber side-circuit which includes the second term.

When the real number component Rp of the load impedance Zp of the processing chamber-side circuit is increased by 50%, the total impedance Ztot including the load variation stabilization circuit 20 is increased by $\{Xa^2/(Xp+Xa)^2\} \times 0.5Rp$.

When the imaginary number component Xa of the impedance Za of the load variation stabilization circuit 20 has "the same sign" as that of the imaginary number component. Xp of the load impedance Zp of the processing chamber-side circuit and is within the range of 0.5 to 1.5 times of the imaginary number component. Xp of the load impedance Zp of the processing chamber-side circuit, the variation in the load of the plasma side can be suppressed. When the impedance Za of the load variation stabilization circuit 20 is small, most of the current flows to the load variation stabilization circuit 20 and, thus, no current flows in the processing chamber 40. Accordingly, the amount of power consumed by the plasma side is reduced, and the power efficiency deteriorates.

FIG. 4 shows an example of changes in the real number component. Rtot of the total impedance Ztot including the load variation stabilization circuit 20 in the case where the real number component Rp of the load impedance Zp of the processing chamber-side circuit is increased by 50% from 1Ω to 1.5Ω. At this time, the imaginary number component Xp of the load impedance Zp of the processing chamber-side circuit was set to −100Ω and the imaginary number component Xa of the impedance Za of the load variation stabilization circuit 20 was set to −100Ω.

The real number component Rtot of the total impedance Ztot was calculated based on the equation (1). Even when the real number component Rp of the load impedance Zp of the processing chamber-side circuit is increased by 50% from 1Ω to 1.5Ω, the variation in the real number component Rtot of the total impedance Ztot is suppressed to ¼ of the variation in the real number component Rp of the load impedance Zp of the processing chamber-side circuit. From the above, it is clear that the variation in the load impedance Zp of the plasma side can be suppressed by the load variation stabilization circuit 20.

Figure 5A:
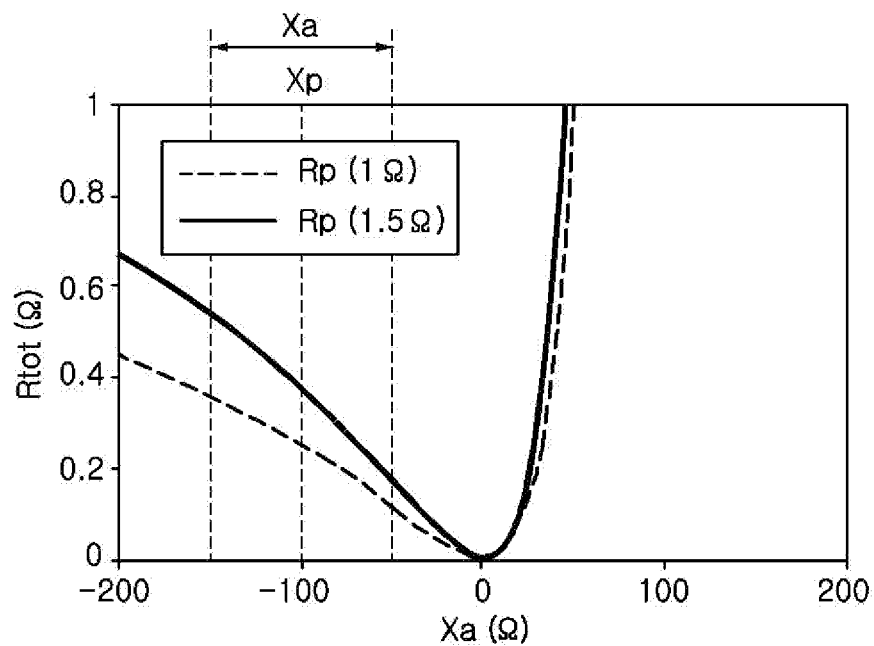
FIG. 5A is a first diagram showing reactance dependency of the load variation stabilization circuit according to the embodiment.
Figure 5B:
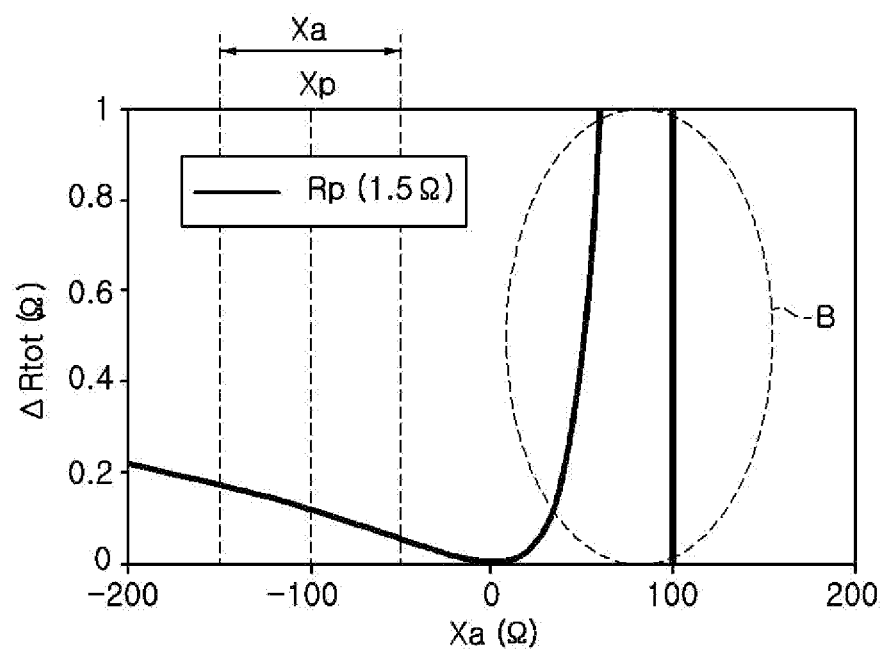
FIG. 5B is a second diagram showing the reactance dependency of the load variation stabilization circuit according to the embodiment.
Figure 5C:
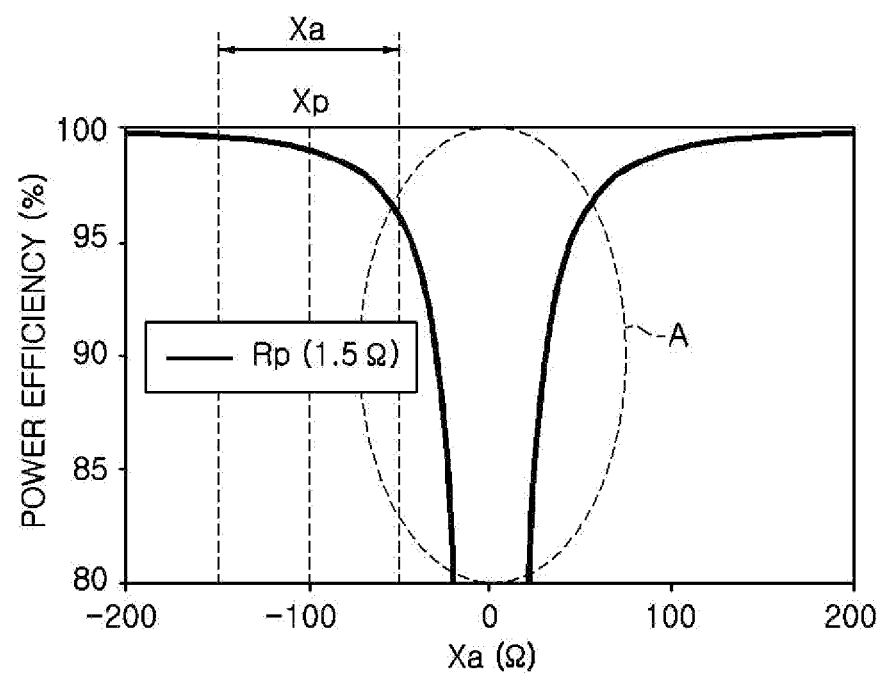
FIG. 5C shows power efficiency of the load variation stabilization circuit according to the embodiment.
Figure 6A:
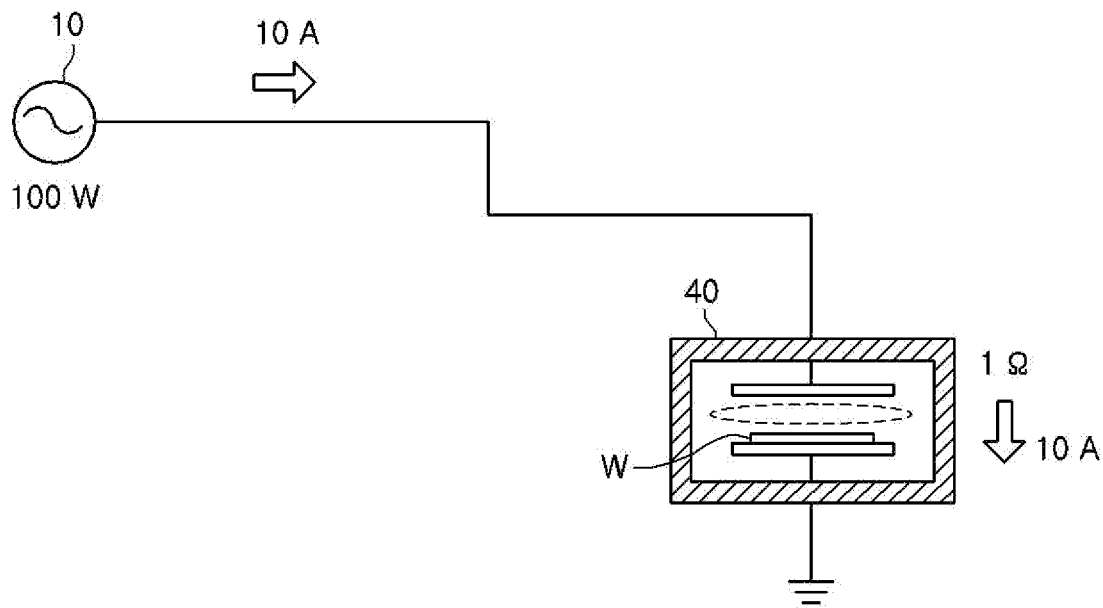
FIG. 6A is a first diagram for explaining constant power control according to one embodiment.

FIGS. 5A to 5C show examples of reactance dependency and power efficiency of the load variation stabilization circuit 20. The power efficiency indicates a ratio of power inputted to the plasma side to the total power outputted from the frequency variable power supply 10. The frequency variable power supply 10 of the present embodiment controls the power to be constant. For example, if the high frequency power controlled to 100 W is outputted from the frequency variable power supply 10, a current of 10 A flows through the processing chamber 40 (plasma) when the load variation stabilizing circuit 20 is not provided and the load on the plasma side is 1Ω, as can be seen from FIG. 6A. A current of 10 A also flows through a power feed line connected to the frequency variable power supply 10.

Figure 6B:
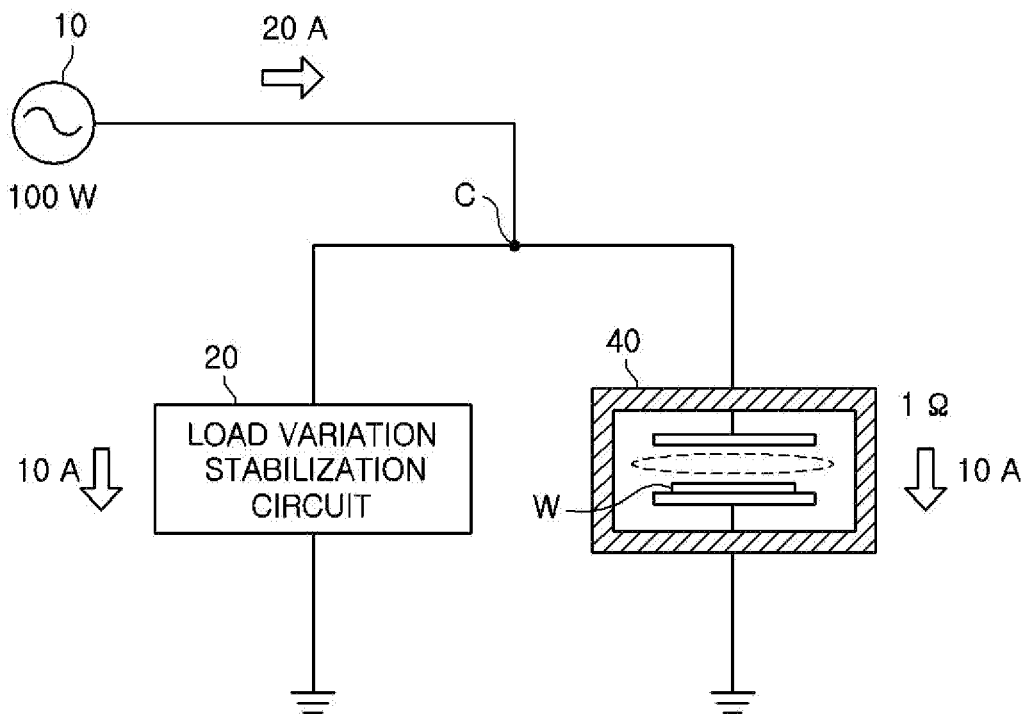
FIG. 6B is a second diagram for explaining constant power control according to one embodiment.

As shown in FIG. 6B, in the case that the load variation stabilization circuit 20 whose impedance is set to is connected in parallel to the processing chamber-side circuit, if the high frequency power of 100 W is outputted from the frequency variable power supply 10 by controlling the power to be constant, a current of 10 A flows through the load variation stabilization circuit 20. In the load variation stabilization circuit 20, the resistance Ra is substantially 0 (Ra≈0) and, thus, the power loss is substantially 0. In the case of the constant power control, a current of 100 W and 10 A flows through the plasma processing apparatus 1 in the processing chamber-side circuit. In other words, in the case of the constant power control, when the load variation stabilization circuit 20 is connected in parallel to the processing chamber-side circuit, the current flowing through the power feed line connected to the variable power supply 10 is increased to 20 A from 10 A that is the current flowing when the load variation stabilization circuit 20 is not connected in parallel to the processing chamber-side circuit. However, the actually consumed power is 100 W which is equal to that in the case where the load variation stabilization circuit 20 is not connected.

FIGS. 5A and 5B show the reactance dependency and the load variation suppression effect of the load variation stabilization circuit 20 based on the above-described constant power control of the frequency variable power supply 10. FIG. 5C shows the power efficiency.

The real number component Rtot of the total impedance Ztot shown in FIG. 5A is calculated based on the equation (1) when the real number component Rp of the load impedance Zp of the processing chamber-side circuit is changed from 1Ω to 1.5Ω. At this time, the imaginary number component Xp of the load impedance Zp of the processing chamber-side circuit is set to −100Ω and the real number component Ra of the impedance Za of the load variation stabilization circuit 20 is set to 0.01Ω.

First, as shown in FIG. 5C, the power efficiency is low in a region. A where the imaginary number component Xa of the impedance Za of the load variation stabilization circuit 20 is "0" and close thereto and, thus, the region A cannot be used.

In a region B shown in FIG. 5B where the variation in the real number component Rtot of the total impedance Ztot is remarkable, i.e., where the sign of the imaginary number Xa of the impedance Z of the load variation stabilization circuit 20 is opposite to the sign of the imaginary number component of the load impedance Zp of the processing chamber-side circuit, the impedance variation ΔRtot is large and the load variation is increased reversely. Accordingly, the region B cannot be used.

Figure 7A:
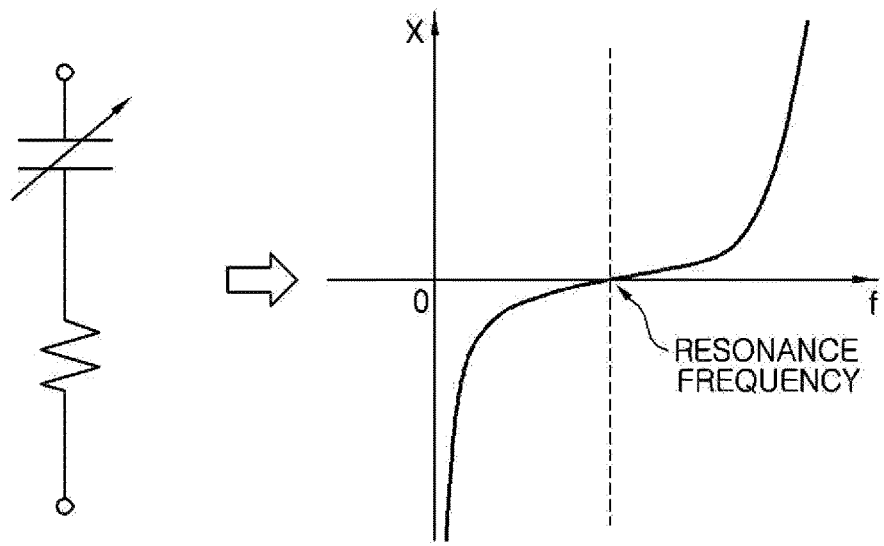
FIG. 7A explains a resonance frequency of an LC series circuit.

As shown in FIG. 7A, in the case of an LC series circuit (where the capacitor and the coil are connected in series), in a region where the frequency f is close to 0, the reactance X of the IC series circuit becomes ∞ to the minus side due to the C component. In a region where the frequency f is high, the reactance X becomes ∞ to the plus side due to the L component. In the resonance frequency, X of the L component and X of the C component are balanced, and X becomes 0 (X=0).

Referring to FIG. 5A, the imaginary number component Xa of the load variation stabilization circuit 20 has the same sign as that of the imaginary number component Xp of the processing chamber-side circuit and is preferably within a range of 0.5 to 1.5 times of the imaginary number component Xp.

From the above, a region where the power efficiency is high and the change in the impedance is gradual, i.e., where the imaginary number component Xa of the impedance Za of the load variation stabilization circuit 20 is equal to the imaginary number component Xp of the load impedance Zp of the plasma-side circuit or within a predetermined range with respect to the imaginary number component Xp of the load impedance Zp of the plasma-side circuit, corresponds to a practical use region. In the present embodiment, the relation of 0.5Xp≤Xa≤1.5Xp, which satisfies that the imaginary number component Xa of the impedance Za of the load variation stabilization circuit 20 is equal to the imaginary number component Xp or the load impedance Zp of the processing chamber-side circuit or within a predetermined range with respect to the imaginary number component Xp of the load impedance Zp of the processing chamber-side circuit, corresponds to the practical use region.

Figure 7B:
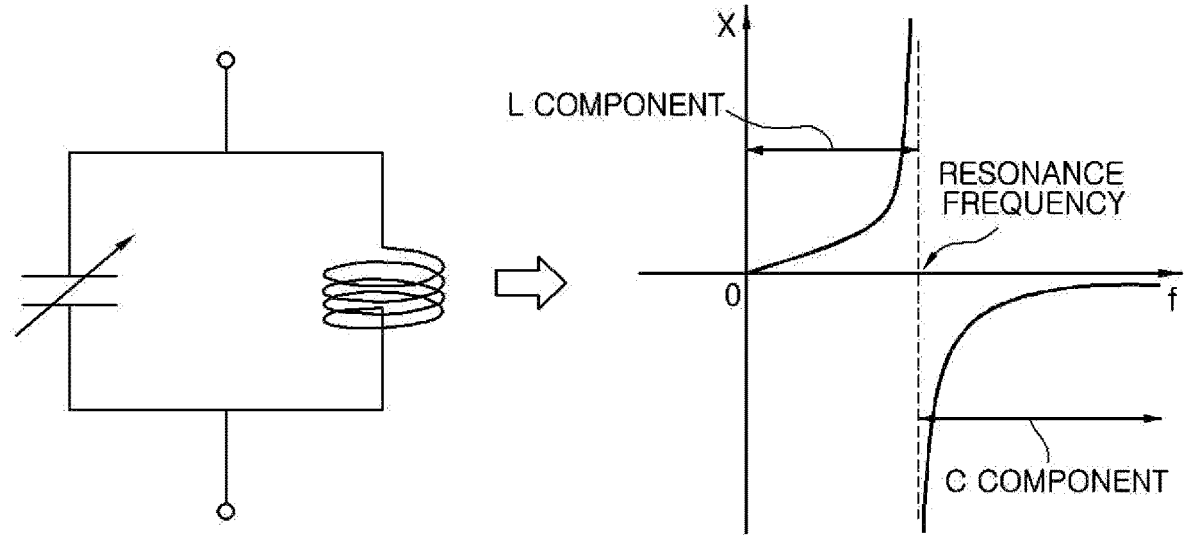
FIG. 7B explains a resonance frequency of an LC parallel circuit.

On the other hand, as shown in FIG. 7B, in the case of the LC parallel circuit (where the capacitor and the coil are connected in parallel), the change in the imaginary number component X of the impedance of the LC parallel circuit by the L component is dominant between the frequency of 0 and the resonance frequency. In a region where the frequency f is higher than the resonance frequency, the change of the imaginary component X of the impedance by the C component is dominant. At X of the resonance frequency, +∞ by the L component and −∞ by the C component exist together and, thus, the load variation becomes remarkably large. Therefore, it is not possible to perform impedance matching at the parallel resonance frequency.

Therefore, the output frequency of the frequency variable power supply 10 is set such that the impedance Za of the load variation stabilization circuit 20 and the load impedance Zp when viewing the processing chamber side from the connection portion C do not cause parallel resonance with respect to the matching frequency.

Test Example

Finally, a result or a test of outputting a frequency power having a frequency of 13 MHz±1 MHz (variable) and a power of 500 W from the frequency variable power supply 10 will be described with reference to FIGS. 8A to 8C. In this test example, the plasma processing apparatus 1 generates plasma by supplying $O_2$ gas at a flow rate of 400 sccm into the processing chamber 40. Further, in this test example, a distance between the upper electrode 101 and the lower electrode 102 in the processing chamber 40 was 15.8 mm. In this test example, a semiconductor wafer W having a diameter of 300 mm was mounted on the lower electrode 102, and plasma treatment is performed on the semiconductor wafer W by $O_2$ plasma generated in the plasma processing space between the upper electrode 101 and the lower electrode 102.

In the plasma processing apparatus 1 of the present embodiment, a matching circuit is originally unnecessary. In the case of using the frequency variable power supply 10, a fixed circuit having an appropriate constant is actually used instead of the matching circuit. However, in this test example, for convenience of the test, a circuit element of a matching circuit 11 shown in FIG. 8A was fixed and used instead of preparing a fixed circuit having an appropriate constant. Originally, this test should show that even if the pressure varies at a high speed for high-speed matching, the frequency variable power supply 10 responds thereto at a high speed and the reflection is suppressed. However, the high speed of the frequency variable power supply 10 is generally well known. Therefore, the test was conducted while focusing on responsibility to the pressure variation in the above-described process of cyclically executing two steps, not on high-speed responsibility of the frequency variable power supply 10.

In the test, the elements of the matching circuit 11 are adjusted and fixed so that the power (Pr) of the reflection wave becomes 0 W at 1.2 T (160 Pa). Then, as the pressure is made to vary (increase) beyond the matching, the high frequency power is reflected without being supplied to the plasma (processing chamber) side. Thus, the power (Pr) of the reflection wave is increased.

When the load variation stabilization circuit 20 is not attached to the plasma processing apparatus 1 (in the case of no circuit in an upper graph of FIG. 8B), the power (Pr) of the reflection wave was abruptly increased. When the pressure was at and around 6 T (800 Pa), the power of about 200 W, with respect to the input power of 500 W, was reflected.

On the other hand, when the load variation stabilization circuit 20 was attached to the plasma processing apparatus 1 (in the case of the existence of the circuit in the upper graph of FIG. 8B), even if the pressure was changed to 8 T (1067 Pa), the power (Pr) of the reflection wave is suppressed to 50 W or less. In other word, it has been found that, when the load variation stabilization circuit 20 is attached, a difference D1 of the reflection wave power can be suppressed by about 200 W, compared to when the load variation stabilization circuit 20 is not attached.

This effect can be realized by allowing the current that is substantially the same as that flowing through the processing chamber side to flow through the load variation stabilization circuit 20. Therefore, the power loss caused by the load variation stabilization circuit 20 becomes a drawback. Accordingly, the power loss caused by the load variation stabilization circuit 20 was evaluated by providing a current sensor 200 between the processing chamber 40 and the power feed line 30 of the plasma-side circuit of the system diagram shown in FIG. 8A and evaluating the current flowing through the plasma-side circuit. The result thereof is shown in the lower graph of FIG. 8C.

When the power loss occurs by the load variation stabilization circuit 20, the power consumed by the plasma is decreased by that amount. As a consequence, the current flowing through the plasma-side circuit is also decreased. In actual measurement, in a region where the reflection is 0 W (1.2 T), the current is not changed regardless of the existence/non-existence of the load variation stabilization circuit. This indicates that the power loss by the load variation stabilization circuit 20 is sufficiently small.

As the pressure is further increased, the current flowing when the load variation stabilization circuit 20 is attached (when the circuit exists) as greater by the difference D2 than that flowing when the load variation stabilization circuit 20 is not attached (when no circuit exists). This indicates that when the load variation stabilization circuit 20 does not exist, large reflection occurs and, thus, the power is not transmitted to the processing chamber side and the current is decreased. On the other hand, when the load variation stabilization circuit 20 is provided, the reflection can be suppressed. Therefore, more current toward the plasma side, compared to when the load variation stabilization circuit 20 is not attached.

By connecting the load variation stabilization circuit 20 in parallel to the processing chamber-side circuit, even if the pressure varies considerably, it is possible to suppress the power of the reflection wave compared to the case where the load variation stabilization circuit 20 is not attached and also possible to avoid the drawback of the power loss in the load variation stabilization circuit 20.

In the present embodiment, the current flows through the load variation stabilization circuit 20 by connecting the load variation stabilization circuit 20 in parallel to the plasma-side circuit. Therefore, when viewed from the variable frequency power source 10, the power is consumed for another purpose other than the plasma generation. However, the power consumed for another purpose other than the plasma generation is small enough not to cause any problem, compared to the reflected power. Therefore, in accordance with the load variation stabilization circuit 20 of the present embodiment, the utilization efficiency of the power outputted from the frequency variable power supply 10 is remarkably improved. In addition, the power of the reflection wave is decreased by the load variation stabilization circuit 20 and, thus, the power outputted from the frequency variable power supply 10 can be sufficiently supplied to the plasma load side.

While the embodiments of the plasma processing apparatus have been described, the plasma processing apparatus of the present invention is not limited thereto, and various modifications and improvements can be made within the scope of the present invention. The contents described in the above embodiments can be combined without contradicting each other.

For example, in the plasma processing apparatus of the present invention, when a high frequency power supply having no function of variably controlling an output frequency is used instead of the variable frequency power supply 10, it is preferable to install a matching circuit together with the load variation stabilization circuit 20. However, when impedance matching can be achieved only by the load variation stabilization circuit 20, it is not necessary to provide the matching circuit.

While the embodiments have been described, the present invention is not limited to the above-described embodiments, and various modifications can be made within the scope of the claims.

This application claims priority to Japanese Patent Application No. 2016-007909 filed on Jan. 19, 2016 with Japanese Patent Office, the entire contents of which are incorporated herein by reference.

DESCRIPTION OF REFERENCE NUMERALS

1: plasma processing apparatus
10: frequency variable power supply
20: load variation stabilization circuit 30: power feed line
40: processing chamber
101: upper electrode
102: lower electrode
C: connection portion
W: semiconductor wafer

What is claimed is:

1. A plasma processing apparatus comprising:
a processing chamber;
a high frequency power supply configured to supply a high frequency power to the processing chamber and generate plasma inside the processing chamber; and
a load variation stabilization circuit connected in parallel with the processing chamber at a connection portion provided between the high frequency power supply and the processing chamber and configured to suppress variation in a load impedance when viewing a downstream side from the connection portion,
wherein a sign of a reactance of the load variation stabilization circuit is the same as a sign of a reactance when viewing the processing chamber from the connection portion.

2. The plasma processing apparatus of claim 1, wherein both of the sign of the reactance of the load variation stabilization circuit and the sign of the reactance when viewing the processing chamber from the connection portion are positive.

3. The plasma processing apparatus of claim 1, wherein the reactance of the load variation stabilization circuit is within a range of 0.5 to 1.5 times of a reactance when viewing the processing chamber from the connection portion.

4. The plasma processing apparatus of claim 1, wherein the high frequency power supply is a frequency variable power supply having a function of performing matching with the load impedance by changing an output frequency.

5. The plasma processing apparatus of claim 4, wherein an impedance of the load variation stabilization circuit and a load impedance when viewing the processing chamber side from the connection portion are set such that parallel resonance does not occur with respect to a matching frequency.

6. The plasma processing apparatus of claim 1, wherein the load variation stabilization circuit includes at least one of a capacitor and a coil.

7. The plasma processing apparatus of claim 6, wherein the load variation stabilization circuit includes the capacitor and the coil connected in series or in parallel.

* * * * *